(12) United States Patent
Hisano et al.

(10) Patent No.: US 7,113,399 B2
(45) Date of Patent: Sep. 26, 2006

(54) COOLING DEVICE FOR ELECTRONIC ELEMENT PRODUCING CONCENTRATED HEAT AND ELECTRONIC DEVICE

(75) Inventors: Katsumi Hisano, Matsudo (JP); Tomonao Takamatsu, Tokyo (JP); Hideo Iwasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 10/615,908

(22) Filed: Jul. 10, 2003

(65) Prior Publication Data

US 2004/0008487 A1     Jan. 15, 2004

(30) Foreign Application Priority Data

Jul. 12, 2002     (JP)    ............................ P2002-204490

(51) Int. Cl.
    *H05K 7/20*     (2006.01)
(52) U.S. Cl. ...................................... 361/688; 62/259.2
(58) Field of Classification Search ................... 62/3.2, 62/3.3, 259.2; 136/203; 165/80.3, 80.4; 361/697, 701, 702, 695, 688
See application file for complete search history.

(56) References Cited

U.S. PATENT DOCUMENTS

| | | | | |
|---|---|---|---|---|
| 5,061,630 A | * | 10/1991 | Knopf et al. ................... 422/99 |
| 5,282,364 A | * | 2/1994 | Cech ............................... 62/3.2 |
| 5,473,506 A | * | 12/1995 | Kikinis ......................... 361/688 |
| 5,504,924 A | * | 4/1996 | Ohashi et al. ............... 361/676 |
| 5,584,183 A | * | 12/1996 | Wright et al. .................. 62/3.7 |
| 5,757,615 A | * | 5/1998 | Donahoe et al. ............. 361/687 |
| 5,992,155 A | * | 11/1999 | Kobayashi et al. ............. 62/3.7 |
| 6,173,576 B1 | * | 1/2001 | Ishida et al. .................... 62/3.7 |
| 6,196,003 B1 | * | 3/2001 | Macias et al. ................. 62/3.7 |
| 6,234,240 B1 | * | 5/2001 | Cheon ........................ 165/80.3 |
| 6,253,556 B1 | * | 7/2001 | Schendel ....................... 62/3.7 |
| 6,276,448 B1 | * | 8/2001 | Maruno ........................ 165/185 |
| 6,298,669 B1 | * | 10/2001 | Maruyama et al. ........... 62/3.2 |
| 6,330,155 B1 | * | 12/2001 | Remsburg ................... 361/695 |
| 6,351,382 B1 | * | 2/2002 | Nakanishi et al. .......... 361/700 |
| 6,424,533 B1 | * | 7/2002 | Chu et al. ................... 361/719 |

(Continued)

FOREIGN PATENT DOCUMENTS

JP     2000-165077     6/2000

(Continued)

OTHER PUBLICATIONS

SP-485-10, Hitachi Inspire the Next, 4 pages, "Notebook PC, Model : FLORA270W Silent Model (A Product Brochure)", Sep. 2002.

*Primary Examiner*—Lynn Feild
*Assistant Examiner*—Ingrid Wright
(74) *Attorney, Agent, or Firm*—Oblon, Spivak, McClelland, Maier & Neustadt, P.C.

(57) ABSTRACT

A cooling device is applied to cooling an electronic element producing concentrated heat in a case where the electronic element is housed in a portable electronic device such as a notebook PC. The cooling device is provided with an active heat transport element provided with a heat intake portion and a heat outlet portion, which conducts heat from the heat intake portion to the heat outlet portion, a first flow channel disposed upstream of the electronic element in flow of the cooling medium, a second flow channel disposed downstream of the electronic element in the flow of the cooling medium. The heat is by-passed by means of the active heat transport element so that the electronic element is exposed to flow of the cooled cooling medium and effectively cooled thereby.

6 Claims, 9 Drawing Sheets

U.S. PATENT DOCUMENTS

| | | | |
|---|---|---|---|
| 6,525,934 B1 * | 2/2003 | Nakanishi et al. | 361/687 |
| 6,542,361 B1 * | 4/2003 | Paradis | 361/687 |
| 6,705,089 B1 * | 3/2004 | Chu et al. | 62/3.2 |
| 6,728,102 B1 * | 4/2004 | Ishikawa et al. | 361/687 |
| 6,778,390 B1 * | 8/2004 | Michael | 361/695 |
| 6,800,933 B1 * | 10/2004 | Mathews et al. | 257/712 |
| 6,822,861 B1 * | 11/2004 | Meir | 361/695 |
| 6,837,057 B1 * | 1/2005 | Pokharna et al. | 62/3.2 |
| 2003/0058616 A1 * | 3/2003 | Wong et al. | 361/688 |
| 2003/0188538 A1 * | 10/2003 | Chu et al. | 62/3.2 |
| 2004/0086780 A1 * | 5/2004 | Ebermann | 429/120 |

FOREIGN PATENT DOCUMENTS

JP        2002-196843        7/2002

\* cited by examiner

CIRCULATION OF COOLANT

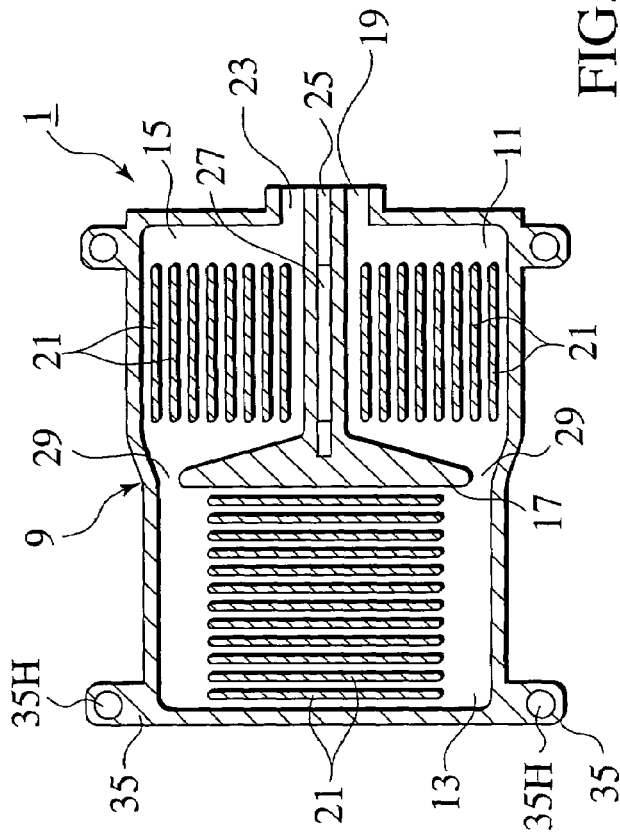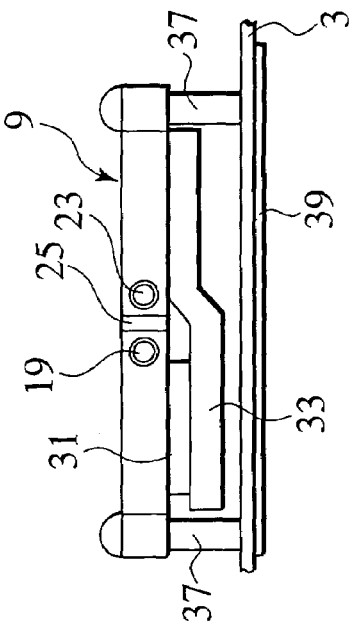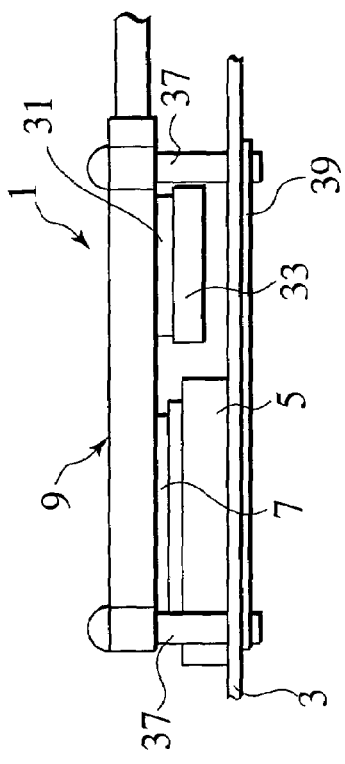

COOLING DEVICE FOR ELECTRONIC ELEMENT PRODUCING CONCENTRATED HEAT AND ELECTRONIC DEVICE

CROSS-REFERENCE TO RELATED APPLICATIONS

This application is based upon and claims the benefit of priority from the prior Japanese Patent Application No. 2002-204490 (filed Jul. 12, 2002); the entire contents of which are incorporated herein by reference.

BACKGROUND OF THE INVENTION

1. Field of the Invention

The present invention relates to a cooling device for effectively cooling an electronic elements producing concentrated heat, such as a CPU, which is employed to a portable electronic device having few space to conduct and radiate the concentrated heat, such as a notebook PC, and a portable electronic device to which the cooling device is installed with an effective configuration.

2. Description of the Related Art

As technology has increased a capacity of electronic elements, it has been found that the amount of produced heat has increased significantly. Though the amount of the heat is in a range of several Watts to several tens Watts, it is far from easy to radiate the heat because the heat is generated in a concentrated manner, for example, it is generated at an area of 1 square centimeter or such. The problem of the concentrated heat comes to be more significant in a case of portable electronic devices, such as a notebook PC, because the portable electronic devices do not have enough space to equip a large cooling fan and a large heat sink.

As a device to effectively radiate the concentrated heat, there is proposed a heat radiation module having an air flow duct and a cooling fan housed therein, which covers a heat sink fixed to a CPU so as to flow relatively strong wind onto the heat sink. The heat radiation module effectively cools the CPU which is the most concentrated heat source in a notebook PC. However, if a heat value of CPU is increased, the heat sink and the cooling fan must be made larger and a rotation speed of the cooling fan must be higher. There is a definite limitation to provide a large heat sink and a large cooling fan with the notebook PC because the notebook PC is lack of a marginal space therein. Further, a severe noise generation caused by the high-speed cooling fan should be avoided because the notebook PC is usually used in a calm space.

Japanese Patent Applications Laid-Open No. 10-254583, No. 9-145273, No. 11-340671 and No. 8-42983 disclose cooling systems for a notebook PC, in which a heat pipe is employed. Japanese Patent Application Laid-Open No. 7-142886 discloses a cooling system for a notebook PC including a flexible tube and a pump for circulation of a liquid coolant.

SUMMARY OF THE INVENTION

The arts set forth in the above disclosures are based on a common technical idea, in which a cooling unit is in close contact with a CPU housed in a main chassis, a sub-chassis housing a LCD panel is provided with a heat radiation unit and the cooling unit and the heat radiation unit are thermally connected with each other by means of a heat pipe or flexible tubes for circulating a cooling medium. Because of employing the sub-chassis, which has a marginal space, for heat radiation, higher efficiency of heat radiation is achieved in comparison with prior arts. However, when heat producing rate of the CPU got larger, an operation temperature of the cooling system would get higher because of a limit of heat radiation efficiency of the heat radiation unit or a limit of heat transport efficiency of the heat pipe or the flexible tube. Such a case gives rise to a higher operation temperature of the CPU and, therefore, leads to a concern about a shorter lifetime or a malfunction of the CPU.

The present invention has been achieved in view of the above problems and is intended for provision of a cooling device which cools an electronic elements producing concentrated heat in high efficiency.

The inventors had reached an idea that the electronic element can be effectively cooled in a case where an active heat transport unit is combined to a cooling system circulating a cooling medium between a main chassis and a sub-chassis so that heat contained in the cooling medium is partly by-passed from a short upstream of the electronic element on a circulation of the cooling medium to a short downstream thereof. Here the active heat transport unit is defined as an element which transports heat from a lower temperature portion to a higher temperature portion with the use of electric power. A Peltier element and a thermocouple are instanced as the active heat transport unit, however, any compact element which has the same function may be employed.

According to a first aspect of the present invention, a cooling device cools an electronic element producing concentrated heat by a flow of a cooling medium. The cooling device is provided with a first flow channel disposed upstream of the electronic element in the flow of the cooling medium, a second flow channel disposed downstream of the electronic element in the flow of the cooling medium and an active heat transport element provided with a heat intake portion and a heat outlet portion. The active heat transport element conducts heat from the heat intake portion to the heat outlet portion. The heat intake portion is thermally connected with the first flow channel so as to conduct heat from the cooling medium and the heat outlet portion is thermally connected with the second flow channel so as to conduct heat to the cooling medium.

As shown in FIG. 1, the cooling medium flows into the heat intake portion before flowing into the electronic element so as to be cooled and kept in relatively low temperature. Therefore the cooling medium effectively cools the electronic element. The cooling medium receives heat produced by the electronic element and flows into the heat outlet portion so as to further receive heat transported through the active heat transport unit. Thereafter the cooling medium circulates to a heat sink housed in a second chassis so as to radiate the heat. The active heat transport unit effectively improves efficiency for cooling the electronic element though the active heat transport unit transports per se transports relatively small amount of heat and needs small consumption of the electric power.

According to a second aspect of the present invention, an electronic device is provided with a first chassis for housing an electronic element and a second chassis connected with the first chassis by means of a hinge so as to be foldable. The electronic device is provided with a cooling medium circuit provided with a pump for circulation of a cooling medium between the first chassis and the second chassis, a cooling device housed in the first chassis and connected with the cooling medium circuit and a heat radiation unit housed in the second chassis and connected with the cooling medium circuit so as to radiate heat transported from the cooling device. The cooling device is provided with an active heat transport element provided with a heat intake portion and a heat outlet portion so as to conduct heat from the heat intake portion to the heat outlet portion, a first flow channel thermally connected with the heat intake portion so as to conduct heat from the cooling medium to the heat intake portion, a cooling portion for heat exchange between the electronic element and the cooling medium and a second flow channel thermally connected with the heat outlet portion so as to conduct heat from the heat outlet portion to the cooling medium. The cooling medium flows from the first flow channel via the cooling portion to the second flow channel.

The second chassis which is provided separately from the first chassis housing the electronic element can be employed to radiate the heat so that more effective heat radiation can be achieved as well as the active heat transport unit keeps the cooling medium flowing into the electronic element in relatively low temperature.

BRIEF DESCRIPTION OF THE DRAWINGS

FIG. 3A is a sectional plan view of a cooling device according to a first embodiment of the present invention;

FIG. 3B is an elevational side view of the cooling device of the first embodiment;

FIG. 3C is an elevational front view of the cooling device of the first embodiment;

DETAILED DESCRIPTION OF THE INVENTION

Figure 1:
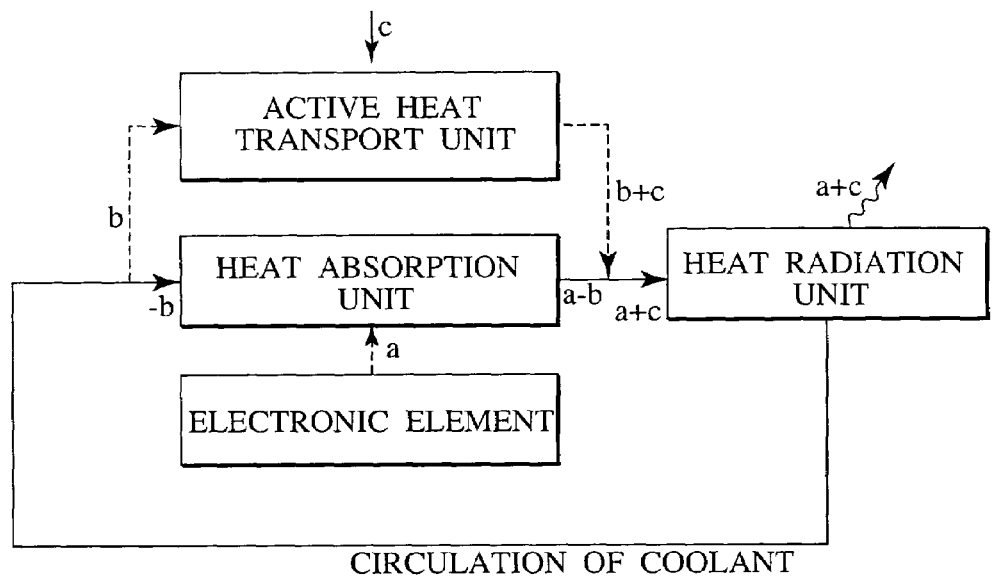
FIG. 1 is a schematic diagram descriptive of an illustration of the present invention.

A first embodiment of the present invention will be described hereinafter with reference to FIGS. 3A–3C. In the following description, a CPU 7 is exemplified as an electronic element and a Peltier element 31 is exemplified as an active heat transport unit, however, the present invention may be enabled with any proper elements or devices other than the CPU 7 and the Peltier element 31.

A cooling device 1 according to the first embodiment is basically composed of a casing 9 which has an inflow port 19 and an outflow port 23 and is made in a watertight manner, the Peltier element 31 and a heat transfer member 33, both of which are connected with a lower side thereof. The cooling device 1 is installed to a substrate 3 of an electronic device so as to be thermally connected with the CPU 7 electrically connected with a socket 5 on the substrate 3.

Inside of the casing 9, as the sectional view thereof shown in FIG. 3A, an element cooling chamber 13, a coolant cooling chamber 11 and a coolant heating chamber 15, both of which communicate with the element cooling chamber 13 via respective communication holes 29 are provided. The element cooling chamber 13, the coolant cooling chamber 11 and the coolant heating chamber 15 are partitioned by a partition wall 17 which is substantially shaped in a T-letter shape.

The coolant cooling chamber 11 communicates with the inflow port 19 so that a cooling medium flows therein. The coolant cooling chamber 11 is further provided with a plurality of fins 21 which are thin-plate shaped and arranged in parallel with a flow direction of the cooling medium. The shape of the fins 21 are not limited as a thin-plate but may be pin-like shaped or omitted properly depending on cases.

The coolant heating chamber 15 is formed symmetrically with the coolant cooling chamber 11, which is also provided with a plurality of fins 21 and communicates with the outflow port 23. The partition wall 17 is provided with a slit 25 at a portion thereof between the coolant cooling chamber 11 and the coolant heating chamber 15 and a heat insulator 27 is put therebetween so that the coolant cooling chamber 11 and the coolant heating chamber 15 are thermally insulated.

The element cooling chamber 13 communicates with the coolant cooling chamber 11 and the coolant heating chamber 15 as described above and is also provided with a plurality of fins 21 arranged in parallel with a flow direction of the cooling medium.

The Peltier element 31 is in close contact with the lower side of the casing 9. One side of the Peltier element 31 is a heat intake portion and another side is a heat outlet portion. The heat intake portion of the Peltier element 31 is in close contact with the lower side of the casing 9, correspondently to the coolant cooling chamber 11, so as to be thermally connected. The heat transfer member 33 shaped like a plate is thermally connected with a lower side of the Peltier element 31, specifically which is the heat outlet portion, and is further connected with the coolant heating chamber 15. The heat transfer member 33 is made of a material which has a high thermal conductivity, such as copper and aluminum, or a heat pipe may be employed as the heat transfer member 33.

The casing 9 is provided with a plurality of brackets 35 projecting from peripheries thereof. The casing 9 is fixed with the substrate 3 and a backing plate 39 for reinforcement thereof by means of installation screws 37 penetrating installation holes 35H of the brackets 35 so as to be in close contact with the CPU 7 as described above.

The inflow port 19 and the outflow port 23 are connected with a cooling medium circuit provided with a pump (not shown). When an electric power c is supplied to the Peltier element 31, the cooling medium flowing into the coolant cooling chamber 11 through the inflow port 19 is cooled in power b as understood from FIG. 1. The cooling medium flows into the element cooling chamber 13 after being cooled, therefore the CPU 7 is more effectively cooled and an operation temperature thereof is suppressed.

Assuming that the cooling medium cools the CPU 7 in power a, the cooling medium flows into the coolant heating chamber 15 with transporting power a–b of heat. Concurrently power c+b of heat is transported to the coolant heating chamber 15 via the Peltier element 31. Thereby totally power a+c of heat is transported from the coolant heating chamber 15 by the cooling medium flowing out of the outflow port 23.

Figure 7:
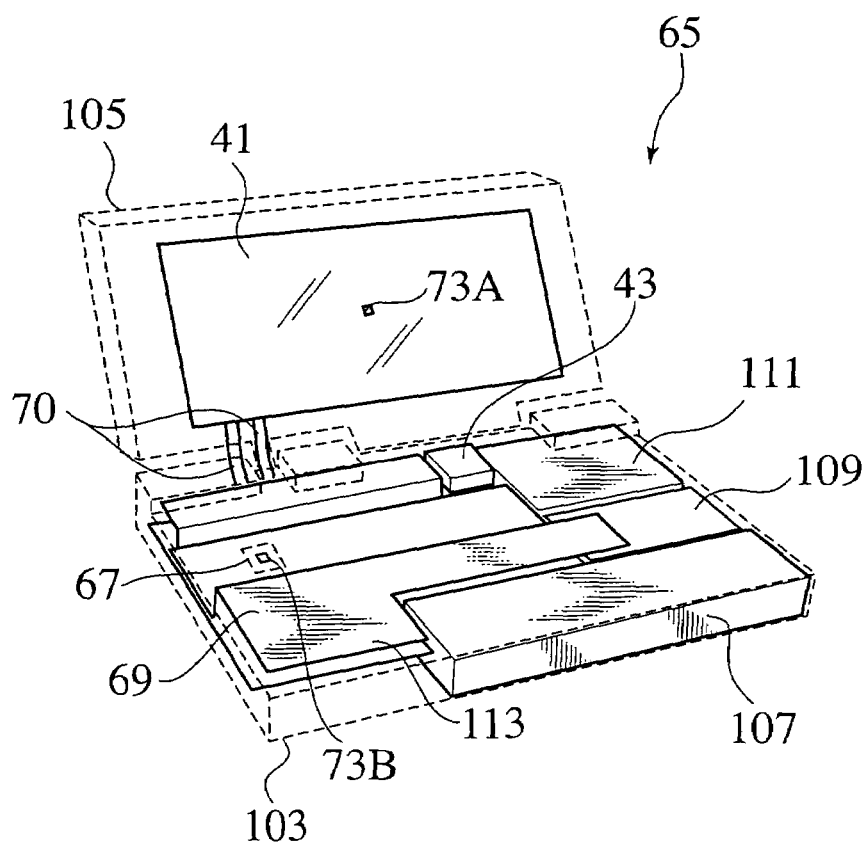
FIG. 7 is a schematic drawing of a notebook PC including the cooling device of the second or third embodiment and a cooling medium circuit of the present invention.

As such constituted, a heat radiation unit 41 for radiation of the heat can be housed in a second chassis 105 separated from a first chassis 103 housing the substrate 3 like as a case shown in FIG. 7.

Figure 2:
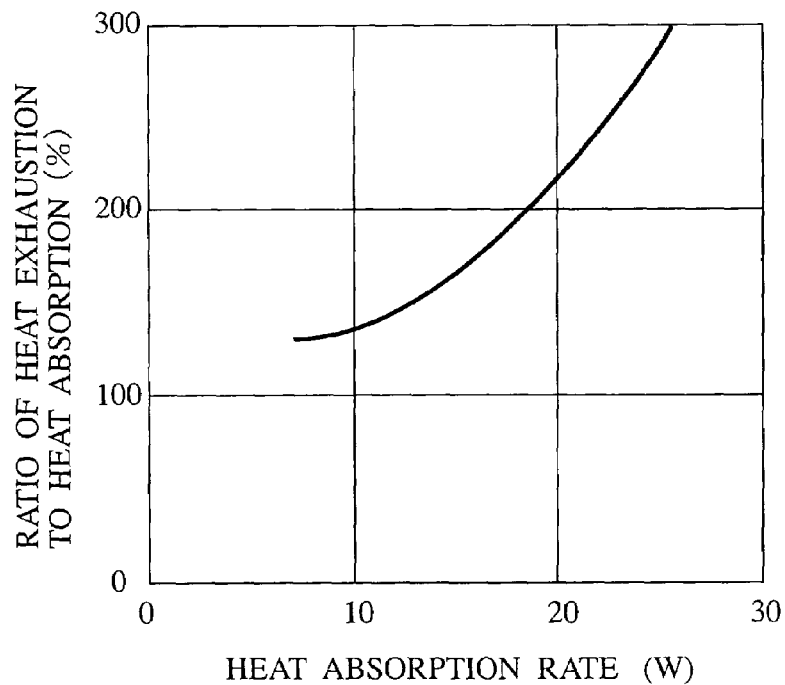
FIG. 2 is a graph showing efficiency of a heat transport of a Peltier element.

Cooling efficiency of the cooling device 1 of the embodiment will be estimated hereinafter. Assuming that the cooling medium is cooled in power b=10 W by the Peltier element 31, a ratio of exhausted heat to absorbed heat is 130% as shown in FIG. 2, therefore b+c=13 W, more specifically, electric power consumption c=3 W. Assuming that heat produced by the CPU 7 is 20 W and completely cooled by the cooling medium, a=20 W. Thereby the heat transport to be incurred by the element cooling chamber 13 is a–b=20 W–10 W=10 W. The heat to be radiated from the heat radiation unit 41 is a+c=23 W.

In comparison with the above case, assuming that a Peltier element directly cools the CPU 7, the ratio of exhausted heat to absorbed heat goes up to more than 200%. Therefore both a heat transport to be incurred by the Peltier element and a heat to be radiated from the heat radiation unit 41 go up to more than 40 W and electric power consumption goes up to more than 20 W.

According to the present invention, in comparison with the comparative example described above, the heat to be radiated from the radiation unit is decreased in half and the electric power consumption is dramatically decreased. The operation temperature of the CPU is more suppressed because the CPU is cooled by the cooling medium which is pre-cooled by the Peltier element. More specifically, the cooling device 1 of the present embodiment is able to effectively cool the CPU 7 in small electric power consumption. Therefore it is understood that the present invention provides a valuable cooling device, which is extremely valuable for a compact electric device such as a notebook PC with few marginal space therein and low tolerance for electric power consumption.

Other embodiments of the present invention will be described hereinafter. In these descriptions, substantially the same constituent elements as ones of the first embodiment are referred with the same reference numerals and detailed descriptions are omitted. Mainly differences will be described.

Figure 4A:
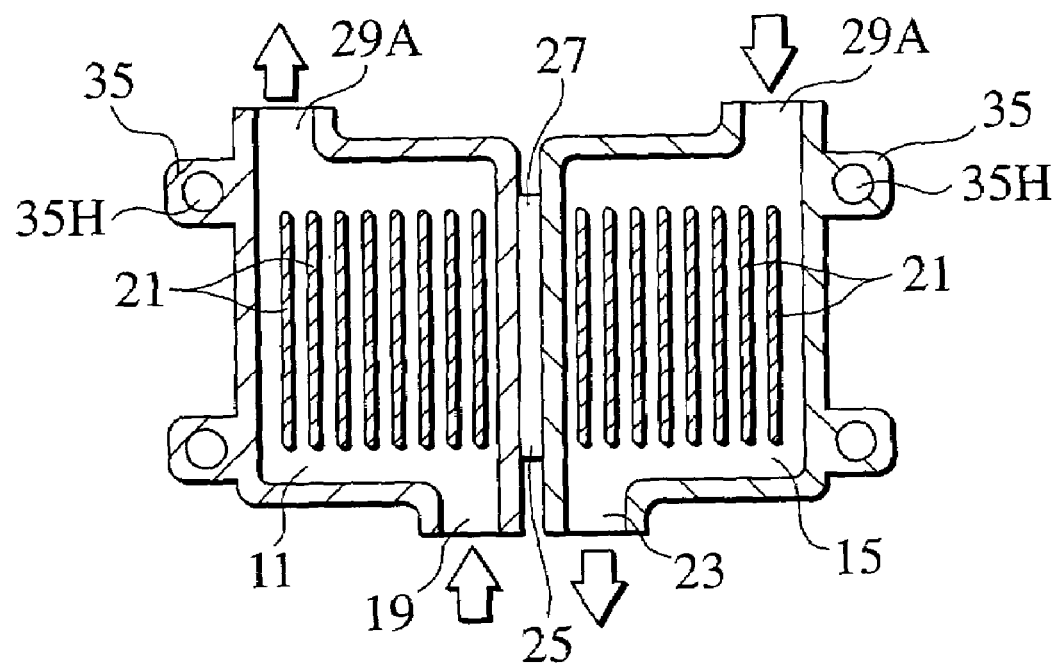
FIG. 4A is a plan view of a cooling device according to a second embodiment of the present invention.
Figure 4B:
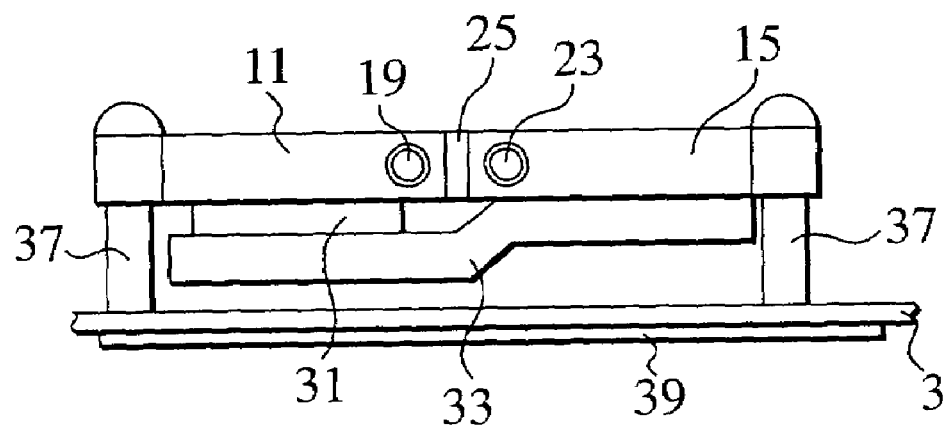
FIG. 4B is an elevational front view of the cooling device of the second embodiment.

A second embodiment of the present invention will be described hereinafter with reference to FIGS. 4A and 4B. According to the second embodiment, an element cooling chamber is separated from the coolant cooling chamber 11 and the coolant heating chamber 15. The coolant cooling chamber 11 and the coolant heating chamber 15 are respectively provided with communication holes 29A so as to be communicated with the element cooling chamber via pipes (not shown).

The second embodiment increases a degree of a design freedom of an electronic device interior because the element cooling chamber can be disposed independently of the coolant cooling chamber 11 and the coolant heating chamber 15.

Figure 5A:
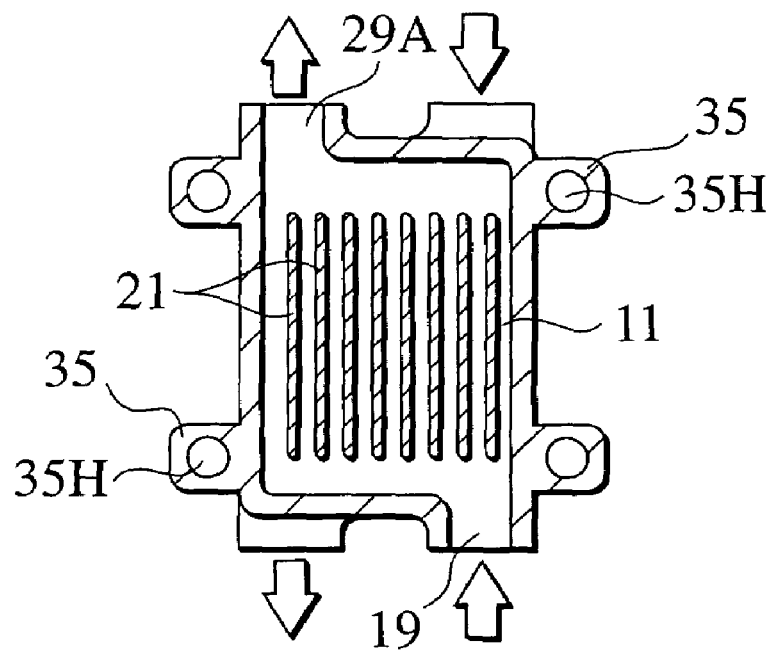
FIG. 5A is a plan view of a cooling device according to a third embodiment of the present invention.
Figure 5B:
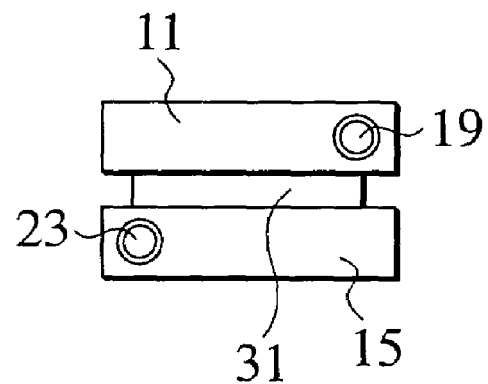
FIG. 5B is an elevational front view of the cooling device of the third embodiment.

A third embodiment of the present invention will be described hereinafter with reference to FIGS. 5A and 5B. Rear surfaces of the coolant cooling chamber 11 and the coolant heating chamber 15 are directed with each other and the Peltier element 31 is put therebetween. The heat transfer member 33 bridged between the Peltier element 31 and the coolant heating chamber 15 is omitted in the third embodiment. The third embodiment can be more simply constituted and heat transfer between the Peltier element 31 and the coolant heating chamber 15 comes to be more effective.

Figure 6:
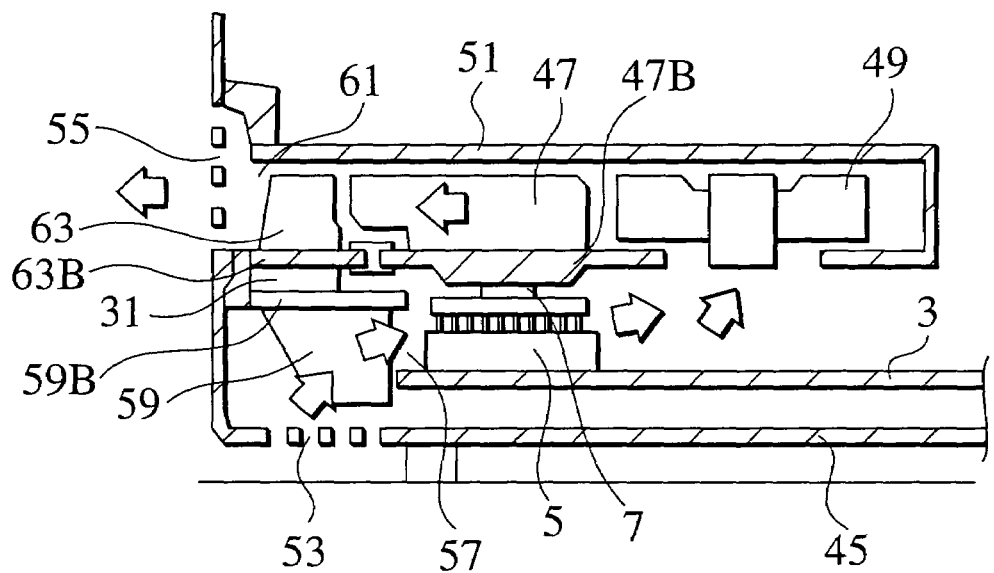
FIG. 6 is a longitudinal sectional view of a certain part of a cooling device according to a fourth embodiment of the present invention.

A fourth embodiment will be described hereinafter with reference to FIG. 6. In the fourth embodiment, air is employed to the cooling medium. A fin base 47B provided with a plurality of fins 47 is in close contact with the CPU 7 housed in the main chassis 45 of the electronic device. The main chassis 45 is provided with an air intake port 53, a flow path 57 communicating with the CPU 7, a duct 51 communicating with the CPU 7, an air exhaust path 61 communicating with the duct 51 and an air exhaust port 55. The duct 51 is provided with a fan 49 inside thereof so that air introduced from the air intake port 53 is conducted via the flow path 57 to the duct 51 and is exhausted via the exhaust path 61 out of the air exhaust port 55.

The flow path 57 is provided with a fin base 59B having a plurality of fins 59 inside thereof and in the vicinity of the air intake port 53. The exhaust path 61 is provided with a fin base 61B having a plurality of fins 61 inside thereof and in the vicinity of the air exhaust port 55. The fin base 59B and the fin base 61B support the Peltier element 31 therebetween so that the fin base 59B is thermally connected with the heat intake portion of the Peltier element 31 and the fin base 61 B is thermally connected with the heat outlet portion.

When the fan 49 is driven, the introduced air flows through the fins 59 so as to be cooled and subsequently cools the CPU 7. After cooling the CPU 7, the air flows through the fins 61 so as to receive heat transported by the Peltier element 31 and is subsequently exhausted outside. The cooling medium for cooling the CPU 7 is limited to air, however, the CPU 7 is effectively cooled on the same basis as the previously described embodiments. Further, according to the present embodiment, the constitution comes to be simpler because the cooling medium circuit and the heat radiation unit can be omitted, differently from the previously described embodiments.

FIG. 7 is a schematic drawing of a notebook PC 56 as an example of the electronic device to which the cooling device of the second or third embodiment is applied.

The notebook PC 56 is provided with an element cooling area 67 corresponding to the element cooling chamber. The coolant cooling chamber 11 and the coolant heating chamber 15 are housed in an auxiliary heat radiation unit 69. The auxiliary heat radiation unit 69 is housed in a main chassis 103 of the notebook PC 56 and is connected with a heat radiation unit 41 housed in a sub-chassis 105 via a pipe line 70. The main chassis 103 further houses a pump 43 connected with the pipe line 70 so that a cooling medium circuit is constituted and the cooling medium is circulated therein.

Figure 8:
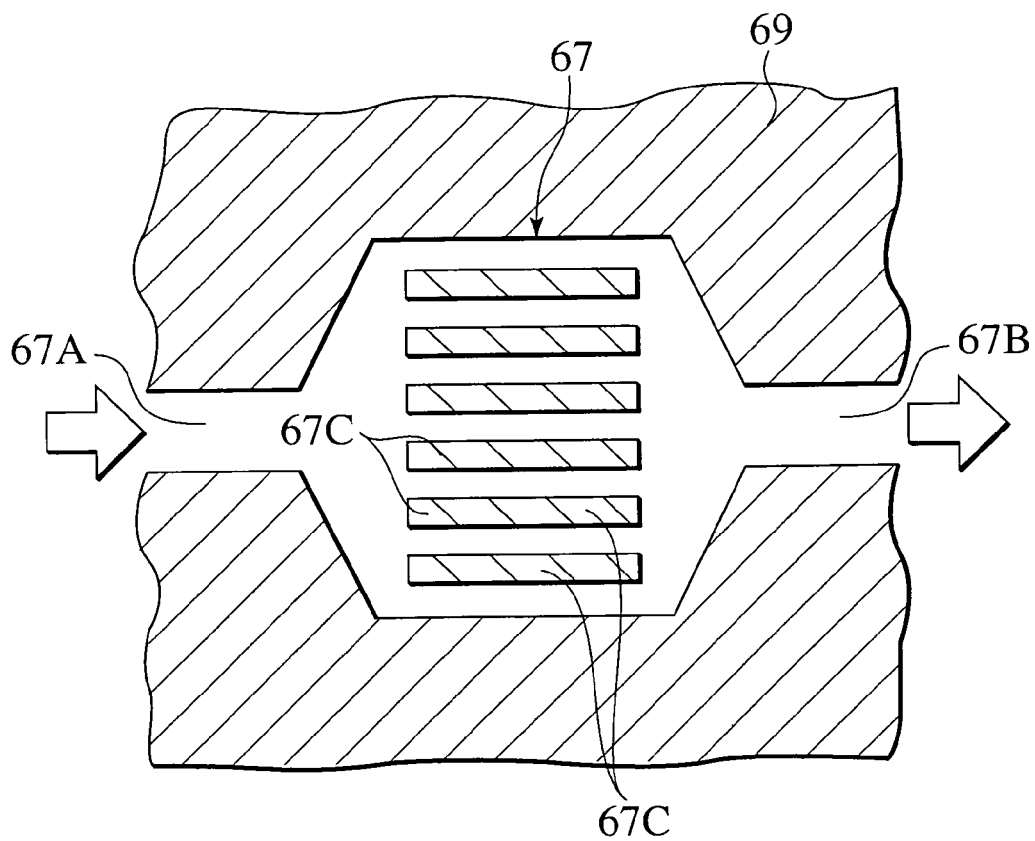
FIG. 8 is a schematic drawing of an element cooling area of the second or third embodiment.

The element cooling area 67 is provided with an inlet port 67A and an outlet port 67B for the cooling medium and is further provided with a plurality of fins 67C therein as shown in FIG. 8. The element cooling area 67 is thermally connected with the CPU 7 installed on a substrate 113 though such feature is not shown.

Figure 9:
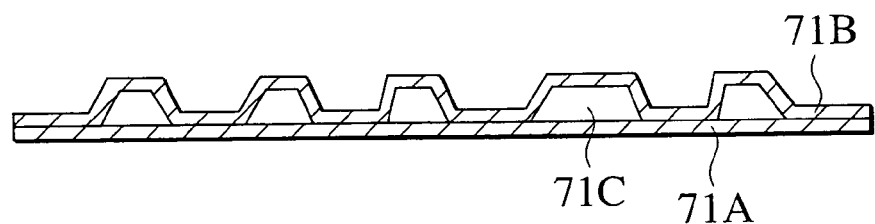
FIG. 9 is a partial sectional view of a heat radiation unit.

The heat radiation unit 41 housed in the sub-chassis 105 is composed of a plane sheet 71A and a wave-like formed sheet 71B adhered thereto, as shown in FIG. 9, and a plurality of gaps formed therebetween are flow paths 71C for the cooling medium. The auxiliary heat radiation unit 69 is also provided with a similar heat radiator therein, though not shown.

Temperature sensors 73A, 73B are respectively installed to the heat radiation unit 41 and the element cooling area 67 so as to measure temperature thereof.

When the pump 43 is driven, the cooling medium circulates so that the CPU 7 is cooled at the element cooling area 67. The cooling medium transporting the heat from the CPU 7 is cooled at both the auxiliary heat radiation unit 69 and the heat radiation unit 41, however, mainly cooled at the heat radiation unit 41. The cooled cooling medium circulates in the cooling medium circuit so as to flow back to the element cooling area 67.

The respective temperatures of the heat radiation unit 41 and the auxiliary heat radiation unit 69 are constantly measured by the temperature sensors 73A, 73B. If improper temperature is sensed, appropriate control to decrease the produced heat of the CPU 7 can be processed, for example, decreasing an operation clock of the CPU 7.

Figure 10A:
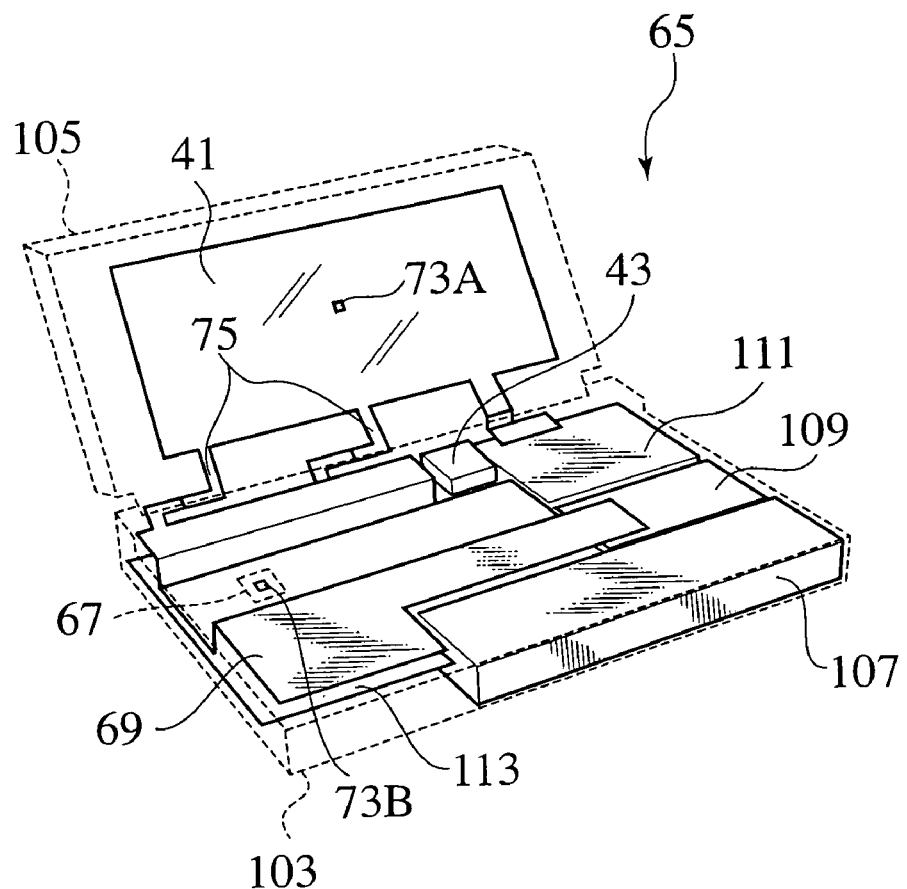
FIG. 10A is a schematic drawing of a notebook PC including the cooling device and the cooling medium circuit to which rotatable tube joints are employed.

Rotatable pipe joints 75 can be applied to the pipe line 70 at hinges connecting the main chassis 103 and the sub-chassis 105 as shown in FIG. 10A.

Figure 10B:
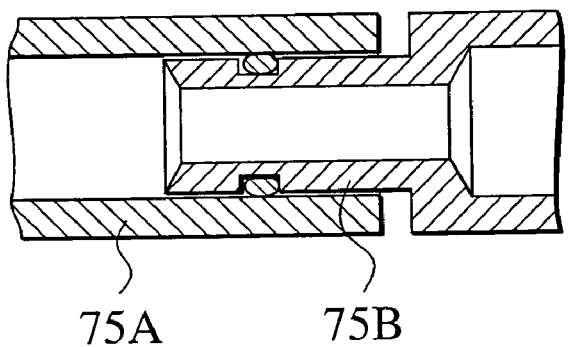
FIG. 10B is a sectional view of a certain part of the rotatable tube joint.
Figure 11:
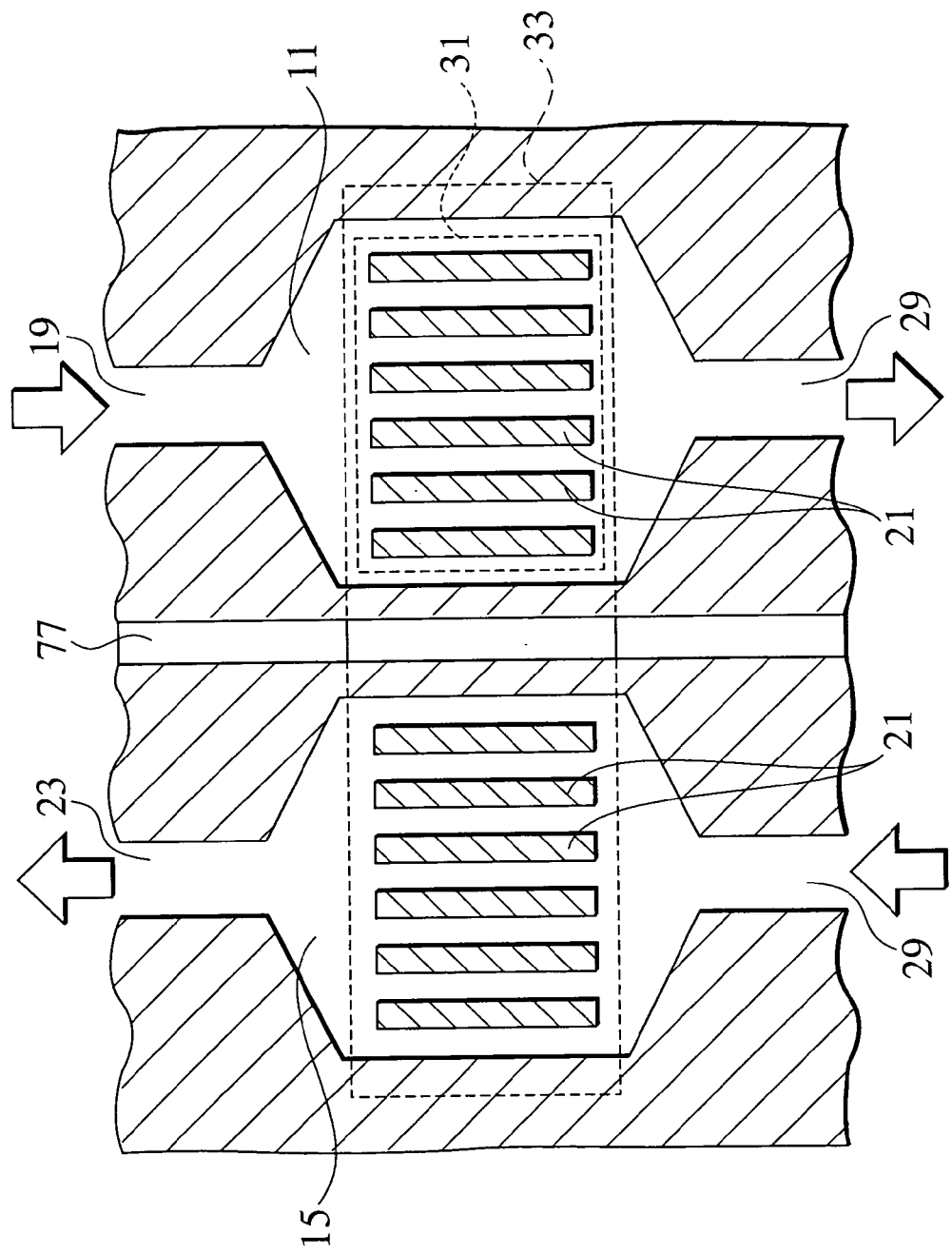
FIG. 11 is a sectional view of a certain part of a supplementary heat radiation unit of the cooling device.

The rotatable pipe joint 75 is composed of, as shown in FIG. 10B, a pipe 75A and another pipe 75B, a leading end of which is formed slightly narrower in diameter and rotatably inserted into the pipe 75A. An O-ring or such is engaged with the pipe 75B so that the cooling medium is prevented from leaking. The rotatable pipe joint 75 can be rotated in accordance with rotation of the hinge and can be formed compact so as to be housed in the hinge, thereby an appearance comes to be better. A lifetime of the rotatable pipe joint 75 is expected to be longer than a flexible tube or such because there are few concern about deterioration caused by repeated bending.

In a case where the coolant cooling chamber 11 is disposed adjacent to the coolant heating chamber 15, heat insulation means such as a slit 77 should be preferably put therebetween.

Figure 12A:
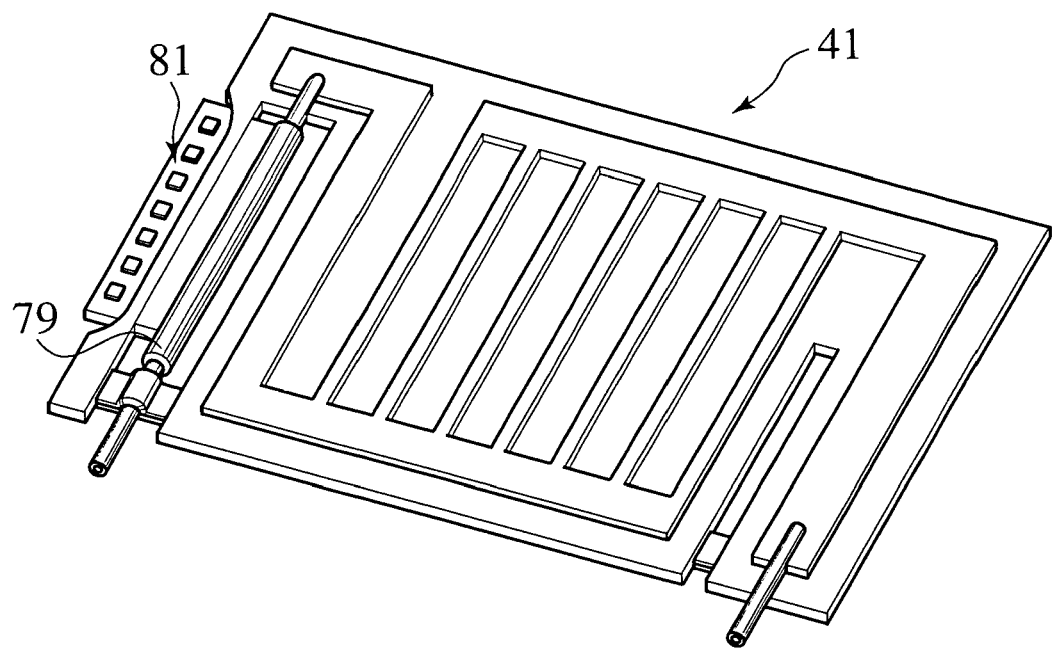
FIG. 12A is a perspective view of a heat radiation unit of a first modification.
Figure 12B:
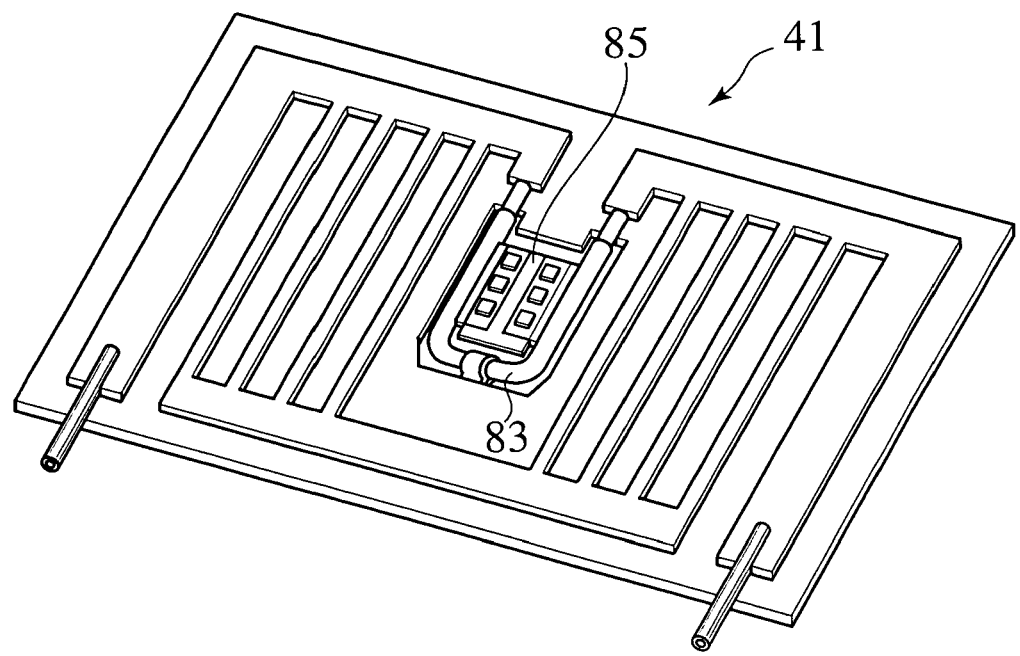
FIG. 12B is a perspective view of a heat radiation sheet of a second modification.

The heat radiation unit 41 can be modified as shown in FIG. 12A where a transparent pipe 79 is applied to a portion of the pipe in the vicinity of an entrance of the cooling medium and a lighting unit 81 provided with a LED and a light guiding plate is installed thereto so as to illuminate the transparent pipe 79. The heat radiation unit 41 can be also modified as shown in FIG. 12B where a U-shaped transparent pipe 83 is applied in a center thereof and illuminated by a lighting unit 85.

According to the above modifications, circulation of the cooling medium can be checked, thereby an inspection in an assembly process of the notebook PC or a maintenance in a course of the operation thereof is easy to be achieved.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A cooling device for cooling an electronic element comprising:
    a cooling portion configured to cool the electronic element by a flow of the cooling medium;
    a first flow channel disposed upstream of the cooling portion in the flow of the cooling medium;
    a second flow channel disposed downstream of the cooling portion in the flow of the cooling medium; and
    an active heat transport element comprising a heat intake portion and a heat outlet portion, the active heat transport element configured to conduct heat from the heat intake portion to the heat outlet portion, the heat intake portion being upstream of the cooling portion and thermally connected with the first flow channel so as to conduct heat from the cooling medium before the cooling medium arrives at the cooling portion, the heat outlet portion being downstream of the cooling portion and thermally connected with the second flow channel so as to conduct heat to the cooling medium.

2. The cooling device according to claim 1, wherein:
    the first flow channel, the second flow channel and the cooling portion are integrally formed.

3. The cooling device according to claim 1, wherein:
    the active heat transport element is a Peltier element.

4. An electronic device including an electronic element producing concentrated heat, the electronic device includes a first chassis for housing the electronic element and a second chassis connected with the first chassis by means of a hinge so as to be foldable, comprising:
    a cooling medium circuit comprising a pump for circulation of a cooling medium between the first chassis and the second chassis;
    a cooling device housed in the first chassis and connected with the cooling medium circuit, the cooling device comprising;
        an active heat transport element comprising a heat intake portion and a heat outlet portion, the active heat transport element configured to conduct heat from the heat intake portion to the heat outlet portion;
        a cooling portion for heat exchange between the electronic element and the cooling medium;
        a flow path including a first flow channel and a second flow channel, the flow path linked with the cooling portion, and configured to conduct the cooling medium from the first flow channel through the cooling portion to the second flow channel, the first flow channel being upstream of the cooling portion and thermally connected with the heat intake portion so as to conduct heat from the cooling medium to the heat intake portion before the cooling medium arrives at the cooling portion, the second flow channel being downstream of the cooling portion and thermally connected with the heat outlet portion to the cooling medium; and
        an auxiliary heat radiation unit connected to the active heat transport element;
        wherein the cooling medium flows from the first flow channel via the cooling portion to the second flow channel; and
    a heat radiation unit housed in the second chassis and connected with the cooling medium circuit so as to radiate heat transported from the cooling device.

5. The cooling device according to claim 1, wherein fins are arranged on the heat intake portion and on the heat outlet portion of the active heat transportation unit, configured to be thermally connected to the active heat transportation unit.

6. The cooling device according to claim 1, wherein the first flow channel, the second flow channel, and the cooling portion form a flow path, the flow path being configured to conduct the cooling medium from the first flow channel through the cooling portion to the second flow channel.

* * * * *